United States Patent [19]

Cockrum et al.

[11] Patent Number: 4,956,304
[45] Date of Patent: Sep. 11, 1990

[54] BURIED JUNCTION INFRARED PHOTODETECTOR PROCESS

[75] Inventors: Charles A. Cockrum; Jeffrey B. Barton, both of Goleta; Eric F. Schulte, Santa Barbara, all of Calif.

[73] Assignee: Santa Barbara Research Center, Goleta, Calif.

[21] Appl. No.: 178,680

[22] Filed: Apr. 7, 1988

[51] Int. Cl.$^5$ .................... H01L 21/10; H01L 21/329
[52] U.S. Cl. .......................................... 437/5; 437/3; 437/185; 437/228; 437/904; 437/22
[58] Field of Search ................ 437/2, 3, 5, 4, 946, 437/185, 904, 22, 228; 148/DIG. 64; 357/30; 156/643

[56] References Cited

U.S. PATENT DOCUMENTS

| | | | |
|---|---|---|---|
| 1,585,517 | 4/1886 | Stemple | 437/946 |
| 3,496,024 | 2/1970 | Ruehrwein | 136/89 |
| 3,677,280 | 7/1972 | Weckler | 437/3 |
| 3,845,494 | 10/1974 | Amurlaine et al. | 357/30 |
| 3,858,306 | 1/1975 | Kloek et al. | 437/185 |
| 3,988,774 | 10/1976 | Cohen-Solal et al. | 437/3 |
| 4,105,478 | 8/1978 | Johnson | 437/3 |
| 4,132,999 | 1/1979 | Maillé et al. | 357/30 |
| 4,181,755 | 1/1980 | Lin et al. | 430/314 |
| 4,206,003 | 6/1980 | Koehler | 437/3 |
| 4,411,732 | 10/1983 | Wotherspoon | 156/643 |
| 4,436,580 | 3/1984 | Boyd | 156/636 |
| 4,439,912 | 4/1984 | Pollard et al. | 437/5 |
| 4,454,008 | 6/1984 | Pohlmann | 204/15 |
| 4,456,630 | 6/1984 | Basol | 437/185 |
| 4,465,565 | 8/1984 | Zanio | 204/56 R |
| 4,532,699 | 8/1985 | Bourdillot et al. | 437/185 |
| 4,549,195 | 10/1985 | Bluzer | 357/30 |
| 4,588,446 | 5/1986 | Tregilgas | 148/1.5 |
| 4,589,192 | 5/1986 | Dihan et al. | 437/3 |
| 4,639,756 | 1/1987 | Rosbeck et al. | 357/30 |
| 4,640,738 | 2/1987 | Fredericks et al. | 156/656 |
| 4,687,542 | 8/1987 | Davis et al. | 156/643 |
| 4,766,084 | 8/1988 | Boby et al. | 437/904 |

FOREIGN PATENT DOCUMENTS

| | | |
|---|---|---|
| 0157273 | 8/1985 | Japan . |
| 3038268 | 2/1988 | Japan . |
| 2100927 | 1/1983 | United Kingdom . |

OTHER PUBLICATIONS

Elliot, *Integrated Circuit Fabrication Technology*, McGraw Hill 1982, pp. 26–37.
Chandlis, *VLSI Fabrication Principles*, John Wiley & Sons, 1983, pp. 510–521, 300–301.
Fujitsu, K. K., "Manufacture of PV Type Infrared Ray Detector," May 1982, Patent Abstracts of Japan, vol. 6, No. 87 (E–108) (965).
Fujitsu, K. K., "Manufacture of Semiconductor Element," Aug. 1984, Patent Abstracts of Japan, vol. 8, No. 190 (E–263) (1627).
J. Ameurlaine, et al., "Infrared HgCdTe Photovoltaic Detectors by Planar Technology," pp. 430–433, Dec. 1978, IEEE International Electron Devices Meeting, Technical Digest.
M. Chu, et al., "High-Performance Backside-Illuminated Hg$_{0.78}$Cd$_{0.22}$Te/CdTe (lambda$_{co}$=10 mum) Planar Diodes", pp. 486–488, Applied Physics Letters, vol. 37, No. 5, Sep. 1980, American Institute of Physics.

*Primary Examiner*—Brian E. Hearn
*Assistant Examiner*—T. N. Quach
*Attorney, Agent, or Firm*—W. C. Schubert; W. K. Denson-Low

[57] ABSTRACT

An array of photodiodes is comprised of a Group II–VI material, such as HgCdTe, which is processed to form a plurality of diode junctions. The array is fabricated by a method which comprises a first step of providing a radiation absorbing base 12 of p-type Hg$_{(1-x)}$Cd$_x$Te material. Each of the photodiodes is fabricated by depositing a layer 18 of wider bandgap passivation material over the substrate, depositing a photomask layer 26 over the passivation layer and selectively removing the passivation layer through openings within the photomask layer. One method of removing the passivation layer 18 is by ion milling which also converts the underlying p-type substrate material to n-type material. The lattice damage caused by the ion milling extends laterally outward such that the n-type region 14, and associated p-n diode junction 16, is disposed beneath the passivation layer 18. Alternatively, the substrate material is converted to an opposite type of conductivity by depositing a layer of source material followed by a diffusion process.

30 Claims, 5 Drawing Sheets

TYPICAL I-V CURVES — AVG Ro = 1.2 MΩ
— AVG R-50 mV = 22.MΩ

BURIED JUNCTION INFRARED PHOTODETECTOR PROCESS

FIELD OF THE INVENTION

This invention relates generally to Group II–VI infrared (IR) photodetectors and, in particular, to a planar array of HgCdTe IR photodiodes which have diode junctions disposed beneath a wider bandgap passivation layer and to a method of fabricating same.

BACKGROUND OF THE INVENTION

Mercury-cadmium-telluride (HgCdTe) photodiodes are typically fabricated in two dimensional arrays and include a layer of passivation applied to a surface of the array, the passivation layer comprising low-temperature photochemical $SiO_2$, evaporated ZnS, or anodically grown CdS. While suitable for some imaging applications it has been found that during certain subsequent processing steps of the array, such as a 100° C., high vacuum bake cycle required to outgas a vacuum Dewar which houses the photodiode array, that such a conventional passivation layer may be disadvantageous. For example, there has been observed a degradation in critical performance parameters such as diode impedance, quantum efficiency, noise (especially at low frequencies), spectral response, and optical area. This degradation is especially evident in long-wavelength detectors. Porosity of the passivation layer and lack of adhesion to the underlying HgCdTe surface are also common problems observed with the aforedescribed conventional passivation layers.

Furthermore, inasmuch as these conventional passivation materials form no more than a coating upon the HgCdTe surface, control over the HgCdTe/passivation interface band structure or energy levels is difficult or impossible to achieve. It is therefore necessary that these passivation materials both create and maintain flatband conditions at the HgCdTe/passivation interface if the array is to maintain a desired level of performance parameters, especially during and after high temperature processing and storage.

Also, conventional fabrication methods for planar arrays of photodiodes typically employ multiple photomask layers in conjunction with ion implantation to form p-n junctions. The steps of these fabrication methods are typically required to be carried out in different types of processing equipment, resulting in increased manufacturing time and cost. The required alignment of the multiple masks and the tolerances associated therewith further results in a minimum achievable junction size which may be larger than desired. Also, the use of multiple masks typically results in a nonoptimum registration between the interface between the photodiode junction, and its associated depletion region, with the overlying surface passivation layer, thereby resulting in increased diode noise currents and reduced yield due to misalignment of mask levels.

SUMMARY OF THE INVENTION

The foregoing problems are overcome and other advantages are realized by an IR photodiode and an array of same constructed in accordance with a method of the invention which comprises the steps of providing a substrate layer comprised of $Hg_{(1-x)}Cd_xTe$ p-type material having a characteristic energy bandgap; depositing a passivation layer over a surface of the substrate layer, the passivation layer having a characteristic energy bandgap which is wider than the characteristic energy bandgap of the substrate layer; depositing a first mask layer over the passivation layer, the first mask layer having openings therethrough for defining individual photodiodes; removing portions of the passivation layer exposed through the openings within the first mask layer thereby exposing portions of the underlying substrate layer, the step of removing simultaneously converting a top surface region of the exposed portions of the substrate layer to an n-type of material thereby forming a p-n diode junction at the interface of the p-type and n-type material, the step of removing causing lattice damage to the p-type material which converts the p-type material to n-type. This lattice damage extends laterally outward from the opening such that the p-n diode junction intersects a top surface of the p-type substrate at a point beneath the passivation layer. The method further comprises steps of depositing a layer of metallization over exposed surfaces of the first mask layer, the passivation layer and the converted top surface regions of the substrate layer; and removing the first mask layer and the associated overlying metallization layer for forming individual photodiodes having contact metallization deposited thereon.

To complete the device or array of devices the method further comprises the steps of depositing a second mask layer having an opening or openings therethrough for defining a ground contact metallization region on the substrate; selectively removing a portion or portions of the passivation layer underlying the opening or openings in the second mask layer, thereby exposing one or more surface regions of the substrate layer; depositing a layer of metallization over the exposed surfaces of the second mask layer and the exposed region or regions of the substrate layer; and removing the second mask layer and the associated overlying metallization.

BRIEF DESCRIPTION OF THE DRAWING

These and other aspects of the invention will be made more apparent in the following Detailed Description of Preferred Embodiments read in conjunction with the accompanying Drawing wherein.

DETAILED DESCRIPTION OF PREFERRED EMBODIMENTS

Figure 1:
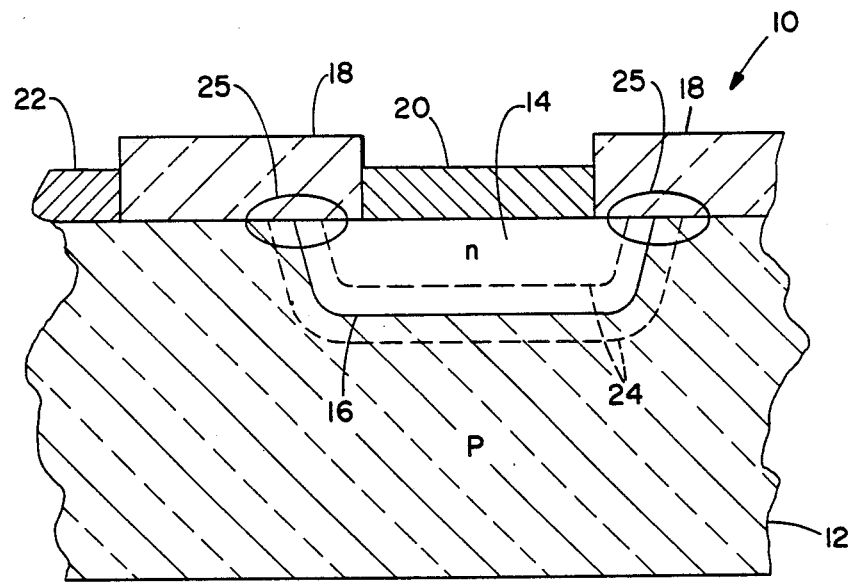
FIG. 1 is a cross-sectional view of a planar photodiode 10, fabricated in accordance with a method of the invention, having a p-n junction 16 and an associated depletion region 24 disposed beneath a wider bandgap passivation layer 18.

FIG. 1 shows a cross-sectional view of a planar, buried junction photodiode 10. A p-type $Hg_{(1-x)}Cd_xTe$ radiation absorbing layer 12 may comprise either bulk or epitaxially grown material having an x value which has a predetermined, sufficiently narrow, bandgap to absorb infrared radiation at wavelengths of interest. For example, the value of x typically ranges from approximately 0.2 for long wavelength infrared radiation (LWIR) devices to approximately 0.4 for short wavelength infrared (SWIR) devices. The interface between the p-type layer 12 and an n-type region 14 defines a diode p-n junction 16. As will be described, the n-type region 14 may be formed by sputter etching, ion beam etching, ion implantation or by diffusion. An overlying passivation layer 18 may be, in accordance with one aspect of the invention, either CdTe, wider bandgap $Hg_{(1-x)}Cd_xTe$, HgCdZnTe, or $Cd_{(1-y)}Zn_yTe$; where y is approximately 0.04 and is preferably selected to lattice match the passivation layer 18 with the p-type HgCdTe layer 12. In general, passivation layer 18 may comprise any suitable material having a wider bandgap than the underlying material of p-type layer 12 and n-type region 14. Layers of contact metallization serve to form a photodiode contact 20 and a common, or ground, contact 22. The contact metal may be comprised of any of a number of materials, such as palladium or titanium, which form an ohmic contact to the HgCdTe while not diffusing significantly into it. The photodiode 10 may be either a frontside illuminated device, wherein infrared radiation enters through the top, passivated surface, or a backside illuminated device, wherein radiation enters though the opposite, bottom surface.

In accordance with the invention, the photodiode 10 comprises a metallurgical p-n junction 16 and an associated depletion region 24 which is disposed beneath the wider bandgap passivation layer 18. That is, the intersection of the junction 16 and the associated depletion region 24 with the top surface of the radiation absorbing layer 12, as indicated by the regions designated 25, is beneath the wider bandgap passivation layer 18, thereby beneficially reducing surface generation currents and other sources of diode leakage current and/or noise.

Figure 2:
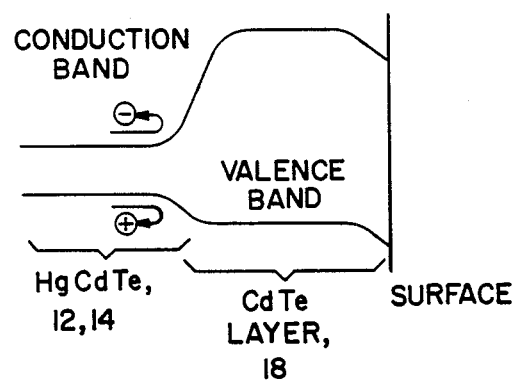
FIG. 2 is a representative energy bandgap diagram showing the repulsion of both electrons and holes from the interface between the wider bandgap passivation layer 18 and the underlying p-type and n-type HgCdTe material.

Referring now to FIG. 2 there is shown an idealized energy band diagram of the photodiode 10 of FIG. 1 wherein the wider bandgap passivation layer 18 is comprised of an epitaxially grown layer of CdTe and wherein the narrower bandgap material comprises either the p-type HgCdTe layer 12 or the n-type HgCdTe region 14. As can be seen, there is shown a continuously varying potential energy in the conduction and valence bands such that the conduction band is bent upwards and the valence band is bent downwards. This results in the repulsion of both electrons and holes, respectively, from the HgCdTe/passivation interface. This repulsion of both electrons and holes from the interface, wherein the relatively high density of lattice dislocations and impurities would otherwise cause excess surface state generation currents and a reduced carrier lifetime, results in the photodiode of the invention exhibiting superior performance over conventional $SiO_2$ passivated photodiodes.

Furthermore, the upper surface of the passivation layer 18 may be doped to isolate charges on the CdTe surface from the underlying HgCdTe surface. In the diagram of FIG. 2 the upper surface of the CdTe passivation layer 16 has been doped with an n-type impurity. If desired, a p-type impurity may be employed instead. A typical doping concentration of the upper surface of the passivation layer 16 is approximately $10^{17}$ atoms/cm$^3$.

Referring now to FIG. 3 there is illustrated, in accordance with one method of the invention, the fabrication of the device 10 of FIG. 1. In FIG. 3 two photodiodes defined by n-type regions 14a and 14b are shown, it being appreciated that a typical array of photodiodes may comprise hundreds or thousands of photodiodes.

Figure 3A:
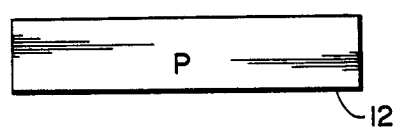
FIGS. 3a–3g illustrate various steps of one preferred method of the invention of fabricating the photodiode 10 of FIG. 1.

FIG. 3a shows a portion of a HgCdTe wafer which comprises the p-type HgCdTe base layer 12 which functions as a radiation absorbing substrate. The base layer 12 may comprise either bulk or epitaxially grown $Hg_{(1-x)}Cd_xTe$ material wherein the value of x is selected for the range of wavelengths which are to be detected by the photodiode. As was previously stated, the value of x may range from approximately 0.2 for LWIR to approximately 0.4 for SWIR. Base layer 12 is placed within a suitable processing chamber having near-vacuum or controlled atmosphere conditions. Typically, the upper surface of the base layer 12 is cleaned prior to the deposition of the passivation layer 18. This cleaning step removes surface oxides and other impurities which would interfere with the deposition of the passivation layer 18. A preferred method of cleaning the surface of layer 12 is a gas phase etch which employs a reactive methyl radical to etch or clean the surface.

Figure 3B:
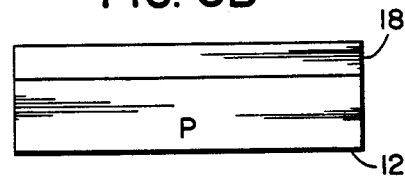

FIG. 3b shows the passivation layer 18 disposed upon the top surface of the HgCdTe layer 12. The passivation layer 18 may be deposited by any of several techniques which may include epitaxial growth from either a liquid or a vapor source or the passivation layer 18 may be deposited by a vacuum deposition technique such as by thermal evaporation or sputter deposition. The passivation layer 18 may be deposited to have a thickness of approximately 5000 angstroms.

The overlying passivation layer 18 may comprise, in accordance with one aspect of the invention, either CdTe, wider bandgap $Hg_{(1-x)}Cd_xTe$ or $Cd_{(1-y)}Zn_yTe$; where y is approximately 0.04 and is preferably selected to lattice match the passivation layer 18 with the p-type HgCdTe layer 12. In general, passivation layer 18 may comprise any suitable material which preferably has a wider bandgap than the underlying material of the p-type layer 12 and also of the n-type region 14, the formation of which will be described below.

Figure 3C:
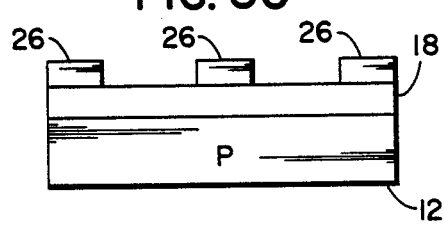

In FIG. 3c a mask layer 26, typically comprised of photoresist, is deposited and exposed utilizing conventional techniques. The mask layer 26 has a plurality of openings therethrough, each of which defines an individual photodiode of the array or a portion of an individual photodiode.

Figure 3D:
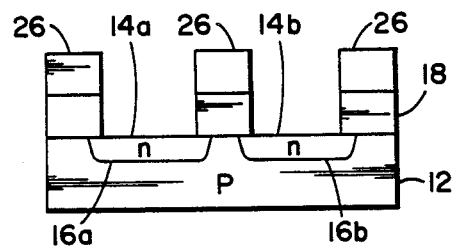

In FIG. 3d portions of the passivation layer 18 are selectively removed through the openings within the mask layer 26. This step of selectively removing portions of the passivation layer 18 is preferably accomplished by an ion milling or a sputter etching technique. For example, the passivation layer 18 may be ion milled by argon atoms which are accelerated by a voltage potential of approximately 500 volts. The lattice damage caused by this etching step also advantageously converts the p-type HgCdTe in the vicinity of the mask openings to n-type regions 14a and 14b, thereby forming p-n junctions 16a and 16b. The lattice damage and effects associated therewith can be seen to extend laterally out from the opening such that edges of the p-n junctions 16a and 16b are disposed, or buried, beneath the surrounding passivation layer 18. That is, the regions 25 of FIG. 1, where the junction and its associated depletion region intersect the surface of the layer 12, are disposed beneath the wider bandgap material of passivation layer 18.

An alternate method of forming the junctions 16 is to implant, through the openings within mask layer 26 and within the p-type layer 12, ions selected for forming the n-type HgCdTe material. This ion implantation may occur either prior to or after the passivation layer etching step. It should be realized that an ion implantation technique also results in substrate lattice damage and the lateral extension of the associated p-n junction, thereby realizing one of the benefits of the invention. That is, the resulting junction 16 is disposed beneath the wider bandgap passivation layer 18.

Figure 3E:
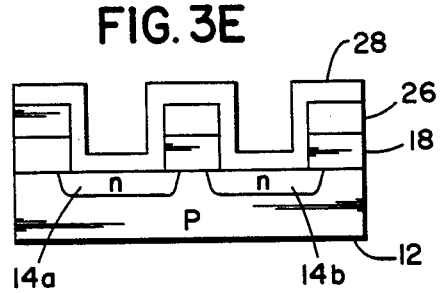

In FIG. 3e there is shown a layer of contact metal 28 deposited over the exposed surfaces of the mask layer 26 and the n-type regions 14. The metal may be deposited by any suitable method such as by sputtering, thermal evaporation, or electron beam deposition. In accordance with the method of the invention this layer 28 of metal is deposited while the wafer is still within the chamber utilized to selectively remove the passivation layer 18. Thus, the passivation layer etching step also serves as a pre-metallization surface cleaning process inasmuch as the surfaces of the device are not exposed to a contaminating or oxide forming atmosphere after the creation of the n-type regions 14.

After deposition of the metal layer 28 the wafer may be removed from the vacuum chamber and the photoresist layer 26 removed thereby rejecting the overlying layer of metal 28 except where it contacts the individual n-type regions 14. Photoresist layer 26 may be removed by any suitable technique, such as immersing or spraying the wafer with acetone.

Figure 3F:
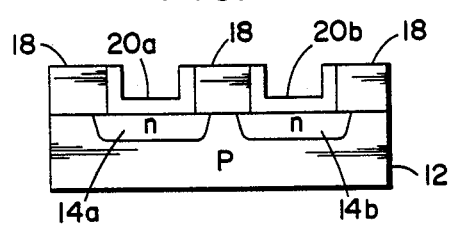

The wafer is shown in FIG. 3f after the mask layer 26 has been removed wherein it can be seen that each of the n-type regions 14a and 14b has an overlying layer of contact metallization 20a and 20b.

Figure 3G:
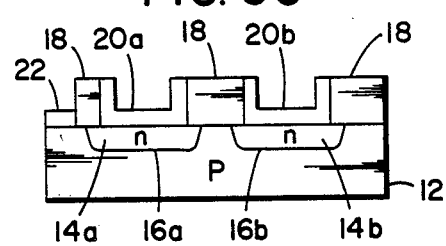

Finally, one or more ground contacts are formed, as shown in FIG. 3g, by providing a ground contact mask; selectively removing, by a technique which does not type-convert the underlying p-type material, a portion of the passivation layer 18 to expose the underlying base layer 12; and depositing a layer of ground contact metallization such that it forms an ohmic contact with the base layer 12. The passivation may be removed by a conventional wet chemical etching technique to prevent the ground contacts from becoming rectifying contacts. The ground contact photoresist mask is thereafter removed, in a manner as described above, to reject the overlying layer of metallization except for the ground contact 22 which is deposited upon the substrate 12.

As can be appreciated from the above set forth description, the method of the invention provides for virtually all of the critical diode fabrication processes to be performed with one photomask layer in a single processing chamber. This significantly reduces the number of processing steps over conventional fabrication methods and further provides for a number of other advantages. For example, the use of one photomask for the critical diode fabrication process eliminates the problem of conventional fabrication techniques related to the alignment of successively applied photomask layers with the features of the wafer. The use of one photomask layer further provides for the fabrication of junctions having reduced areas over conventional junctions, the junction area being determined in large part by the area of the opening within the single photomask layer 26. A typical junction width which is achievable by the method of the invention is approximately 3 to 4 microns as compared to conventional minimum junction widths of 15 to 20 microns. Conventional junctions may have an area which is larger than desired because of the problems associated with the registration of successive photomask layers. This beneficial reduction in junction area results in improved diode performance due to at least a reduction in junction capacitance and a reduction in leakage current from the smaller depletion region. Also, inasmuch as the wafer is not required to be removed from the vacuum processing apparatus during fabrication, repeated surface cleaning procedures are typically not required.

Figure 4A:
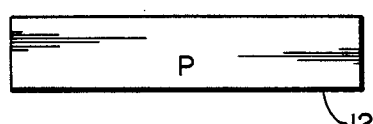
FIGS. 4a–4k illustrate various steps of another preferred method of the invention of fabricating the photodiode 10 of FIG. 1.
Figure 4B:
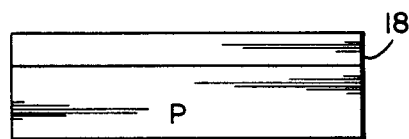
Figure 4C:
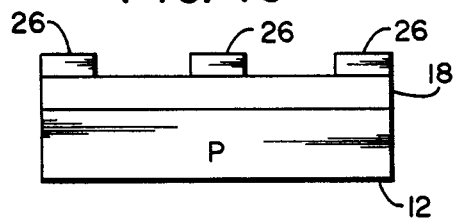
Figure 4D:
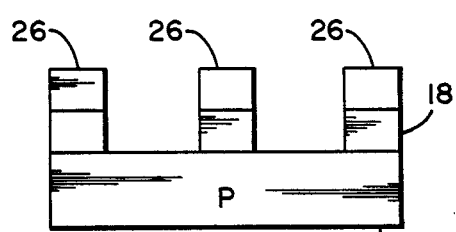
Figure 4E:
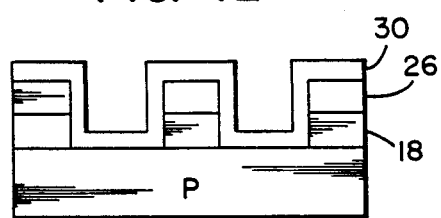
Figure 4F:
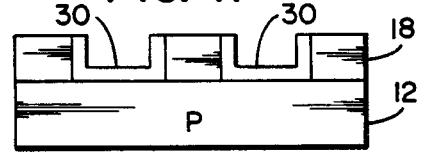
Figure 4G:
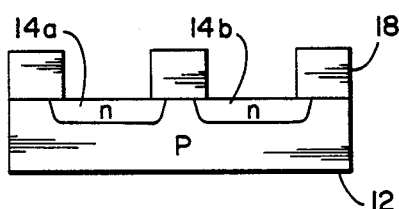
Figure 4H:
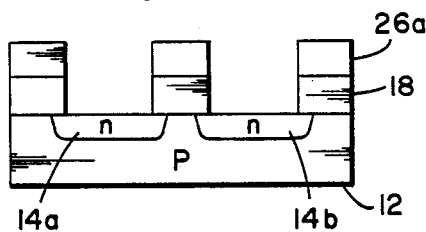
Figure 4I:
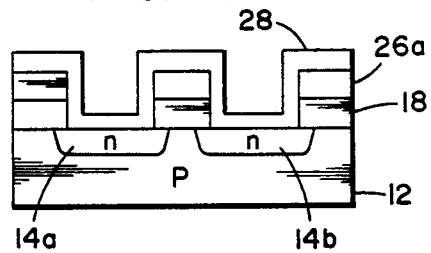
Figure 4J:
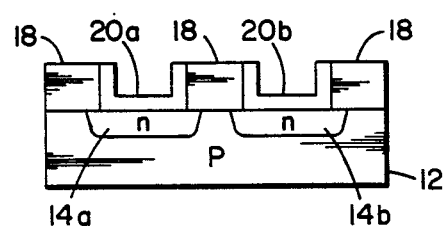
Figure 4K:
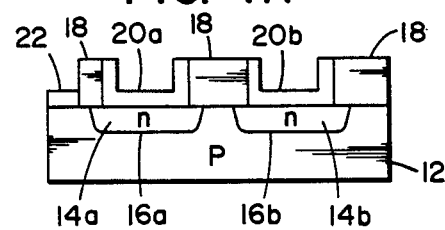

Referring to FIGS. 4a-4k there is illustrated another method of the invention which forms by a diffusion process p-n diode junctions which lie under the passivation layer 18. Steps 4a-4c are substantially the same as steps 3a-3c above. In step 4d portions of the passivation layer 18 are selectively removed through the openings within mask layer 26. This step of selectively removing may be accomplished by the aforementioned wet chemical etch such that the underlying p-type substrate is not converted to n-type. In step 4e a relatively thin source layer 30 of a suitable n-type dopant is deposited over the surfaces of the photoresist layer 26 and the surfaces exposed within the openings. For example, the source layer 30 may comprise indium and may have a thickness of approximately 100 angstroms. FIG. 4f shows the structure after the photoresist layer is removed, thereby rejecting the overlying source layer 30 except where it contacts the layer 12 and the exposed surfaces of the passivation layer 18. A heating process is thereafter performed which diffuses indium from the source layer 30 into the p-type layer 12, thereby converting the p-type material and forming the diffused n-type regions 14a and 14b. As can be seen in FIG. 4g, diffused the n-type regions 14a and 14b extend laterally outwards and the resultant p-n junctions underlie the passivation layer 18. FIG. 4h shows a second photomask layer 26a which is applied by a conventional method such that it overlies the passivation layer 18. The steps illustrated in FIGS. 4i through 4k are substantially the same as FIGS. 3e through 3g, described above, wherein contact metallization and ground metallization are provided with the second and third mask layers.

As described above, the mask layer 26 is removed in step 4f before the step of diffusing is accomplished. This is preferable in that the heat applied during the diffusion process may cause a polymerization of the mask layer 26, making the subsequent removal of the layer 26 difficult to accomplish. It can be appreciated that, depending on the type of material which comprises the mask layer 26, the diffusion step may be accomplished before the removal of the mask layer 26.

The method illustrated in FIGS. 4a-4k has an additional advantage in that inasmuch as the p-n diode junctions are formed by a diffusion process, an n-type substrate may be employed and p-type regions may be formed therein by diffusion of a suitable p-type dopant. One suitable p-type dopant is arsenic. Another suitable dopant is antimony.

One still further advantage which accrues from the use of the methods of the invention is that the process whereby the n-type region is formed provides for the formation of the photodiode p-n junction 16 beneath the wider bandgap passivation layer 18. Thus, the region where the junction 16 intersects the surface of the p- type base layer, this region being characterized by surface discontinuities and resultant surface generation states, is disposed beneath the passivation layer 18. A consequent reduction in diode noise and an improvement in several diode operational characteristics is thereby achieved.

Figure 5A:
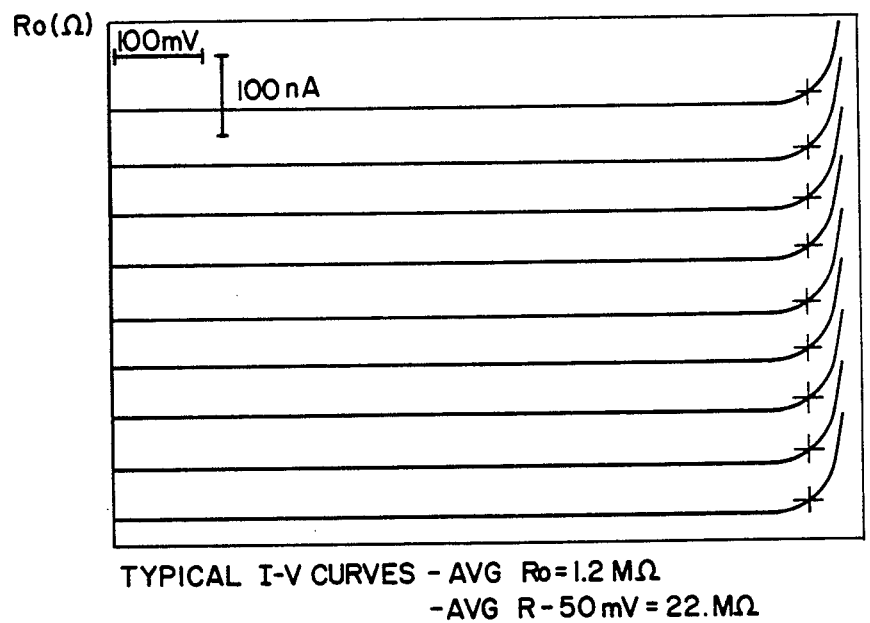
FIGS. 5a–5d are graphs illustrating the performance of a MWIR photodiode constructed in accordance with the invention.
Figure 5B:
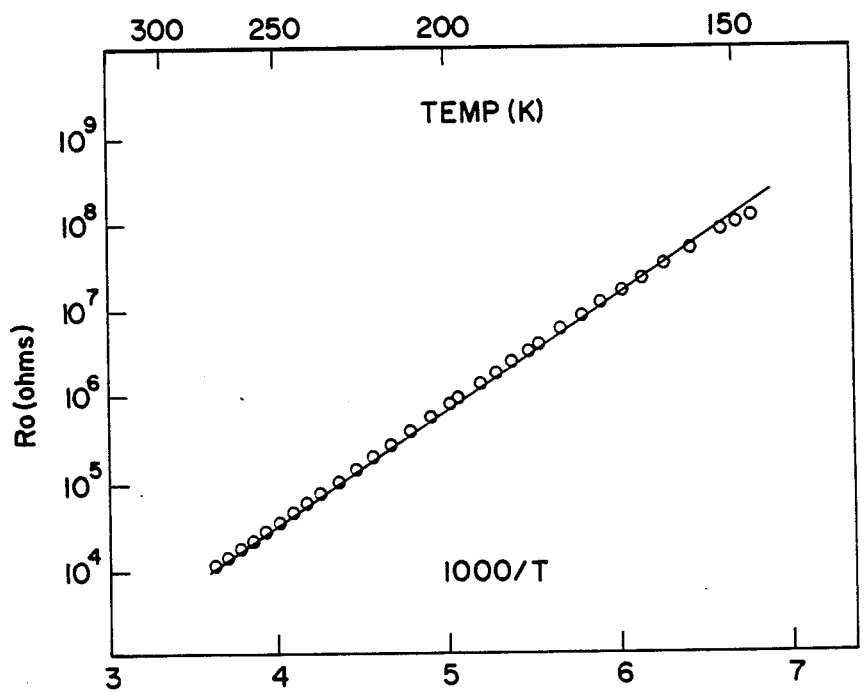
Figure 5C:
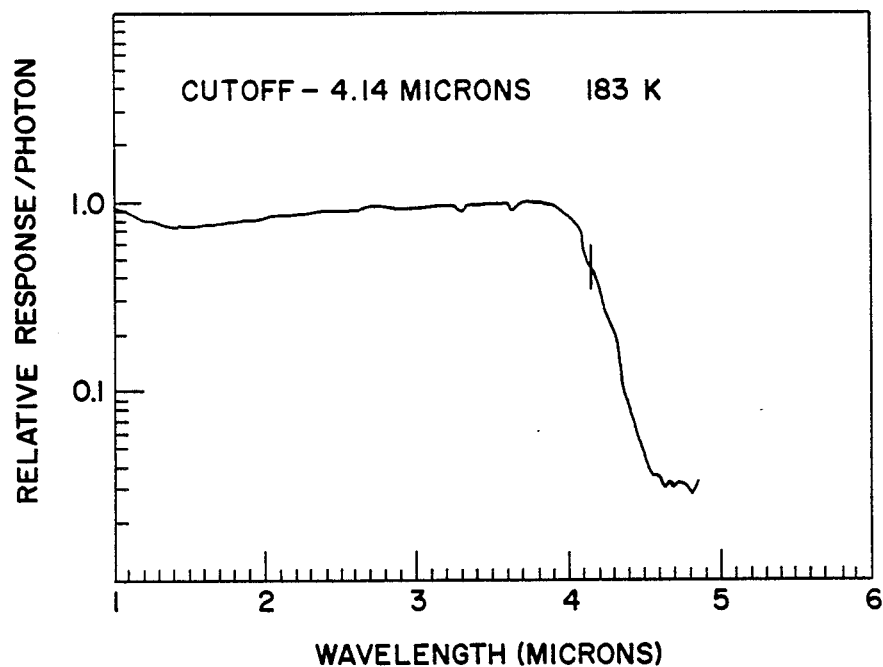
Figure 5D:
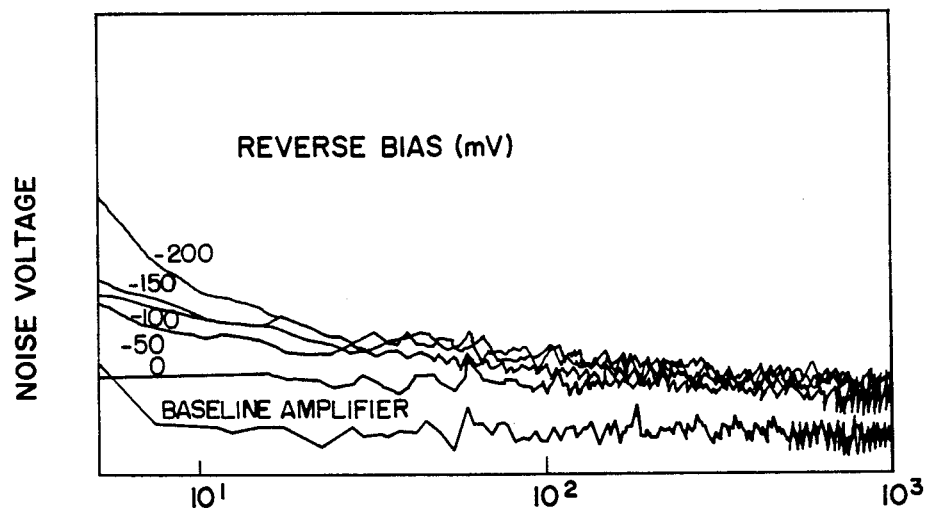

Referring now to FIGS. 5a–5d there is shown in graphical form the performance of a high density, MWIR detector array fabricated in accordance with the method of the invention. From the graphs it can be seen that the photodiodes exhibit uniform I–V curves having no indication of breakdown at 700 millivolt reverse bias, an average $R_o$ of approximately 1.2 Mohm and an average $R_{-50mv}$ of approximately 22 Mohm. The $R_o$ versus temperature curve indicates a diffusion limited performance to approximately 150 K. FIG. 5c shows a relatively flat spectral response having a cutoff wavelength of approximately 4.14 microns. FIG. 5d illustrates noise versus frequency curves which substantially independent of photodiode reverse bias and which have knee frequencies of less than approximately 100 Hz.

As has been previously stated, presently preferred embodiments of the invention have herein been described. It is possible that those skilled in the art may derive modifications to these presently preferred embodiments based upon the foregoing disclosure. Thus, it should be understood that the invention is not to be limited to only the presently preferred embodiments disclosed above but is instead intended to be limited only as defined by the appended claims.

What is claimed is:

1. A method of fabricating an IR responsive photodiode or an array thereof comprising the steps of:

providing a substrate layer comprised of a Group II–IV semiconductor material having a first type of electrical conductivity and a characteristic energy bandgap;

forming a passivation layer over a surface of the substrate layer, the passivation layer having a characteristic energy bandgap which is wider than the characteristic energy bandgap of the substrate layer;

depositing a first mask layer over the passivation layer, the first mask layer having one or more openings therethrough for defining one or more individual photodiodes;

selectively removing portions of the passivation layer exposed through the openings within the first mask layer thereby exposing portions of the underlying substrate layer, the step of selectively removing simultaneously converting a top surface region of the exposed portions of the substrate layer to an opposite type of electrical conductivity, thereby forming a p-n diode junction, the step of selectively removing further simultaneously cleaning a top surface of the converted top surface region for preparing the exposed portions of the underlying substrate layer for a subsequent metallization step;

depositing a layer of metallization over exposed surfaces of the first mask layer, the passivation layer and the converted top surface regions of the substrate layer, the step of depositing a layer of metallization occurring within a same processing chamber means as occurred the step of selectively removing, the step of depositing a layer of metallization further occurring before the substrate layer is removed from the processing chamber means; and removing the first mask layer and the associated overlying metallization layer for forming individual photodiodes having contact metallization deposited thereon.

2. The method of claim 1 and further comprising the steps of:

depositing a second mask layer having an opening or openings therethrough for defining a ground contact metallization region on the substrate;

selectively removing a portion or portions of the passivation layer underlying the opening or openings in the second mask layer, thereby exposing one or more surface regions of the substrate layer;

depositing a layer of metallization over the exposed surfaces of the second mask layer and the exposed region or regions of the substrate layer; and removing the second mask layer and the associated overlying metallization.

3. The method of claim 1 wherein the step of depositing a passivation layer is accomplished by an epitaxial growth of a layer of wider bandgap material upon the surface of the substrate layer such that a heterostructure is formed between the substrate layer and the passivation layer.

4. The method of claim 1 wherein the step of forming a passivation layer is accomplished by evaporating a layer of semiconductor material upon the surface of the substrate layer.

5. The method of claim 1 wherein the step of forming a passivation layer is accomplished by sputter deposition.

6. The method of claim 1 wherein the step of forming a passivation layer is accomplished by forming a layer comprised of CdTe.

7. The method of claim 1 wherein the step of forming a passivation layer is accomplished by forming a layer comprised of $Cd_{(1-y)}Zn_yTe$.

8. The method of claim 7 wherein y has a value selected to lattice match the passivation layer to the substrate layer.

9. The method of claim 1 wherein the step of selectively removing is accomplished by an ion milling technique.

10. The method of claim 1 wherein the step of selectively removing is accomplished by a sputter etching technique.

11. The method of claim 1 wherein the step of forming a passivation layer comprises an initial step of cleaning the surface of the substrate.

12. The method of claim 11 wherein the step of cleaning is accomplished by a gas phase etch which utilizes a methyl radical to etch the surface of the substrate.

13. A method of fabricating an array of IR radiation responsive photodiodes comprising the steps of:

providing a substrate layer comprised of $HG_{(1-x)}Cd_xTe$ p-type material having a characteristic energy bandgap;

depositing a passivation layer over a surface of the substrate layer, the passivation layer having a characteristic energy bandgap which is wider than the characteristic energy bandgap of the substrate layer;

depositing a first mask layer over the passivation layer, the first mask layer having openings therethrough for defining individual photodiodes;

removing portions of the passivation layer exposed through the openings within the first mask layer thereby exposing portions of the underlying substrate layer, the step of removing simultaneously converting a top surface region of the exposed portions of the substrate layer to an n-type of material thereby forming a p-n diode junction at the interface of the p-type and n-type material, the step of removing causing lattice damage to the p-type material which extends laterally outward from the n-type region such that the p-n diode junction intersects a top surface of the p-type substrate at a point beneath the passivation layer, the step of removing further simultaneously cleaning a top surface of the converted top surface region for preparing the exposed portions of the underlying substrate layer for a subsequent metallization step;

depositing a layer of metallization over exposed surfaces of the first mask layer, the passivation layer and the converted top surface regions of the substrate layer, the step of depositing a layer of metallization occurring within a same processing chamber means as occurred the step of selectively removing, the step of depositing a layer of metallization further occurring before the substrate layer is removed from the processing chamber means; and removing the first mask layer and the associated overlying metallization layer for forming individual photodiodes having contact metallization deposited thereon.

14. The method of claim 13 and further comprising the steps of:

depositing a second mask layer having an opening or openings therethrough for defining a ground contact metallization region on the substrate;

selectively removing a portion or portions of the passivation layer underlying the opening or openings in the second mask layer, thereby exposing one or more surface regions of the substrate layer;

depositing a layer of metallization over the exposed surfaces of the second mask layer and the exposed region or regions of the substrate layer; and removing the second mask layer and the associated overlying metallization.

15. The method of claim 13 wherein the step of depositing a passivation layer is accomplished by an epitaxial growth of a layer of semiconductor material upon the surface of the substrate layer such that a heterostructure is formed between the substrate layer and the passivation layer.

16. The method of claim 13 wherein the step of depositing a passivation layer is accomplished by evaporating a layer of wider bandgap material upon the surface of the substrate layer.

17. The method of claim 13 wherein the step of depositing a passivation layer is accomplished by sputtering a layer of wider bandgap material upon the surface of the substrate layer.

18. The method of claim 13 wherein the step of depositing a passivation layer is accomplished by depositing a layer of CdTe.

19. The method of claim 13 wherein the step of depositing a passivation layer is accomplished by depositing a layer of $Hg_{(1-x)}Cd_xTe$ which has a wider bandgap than the underlying layer of $Hg_{(1-x)}Cd_xTe$.

20. The method of claim 13 wherein the step of depositing a passivation layer is accomplished by depositing a layer of $Cd_{(1-y)}Zn_yTe$.

21. The method of claim 20 wherein y has a value selected to lattice match the passivation layer to the substrate layer.

22. The method of claim 13 wherein the step of removing portions of the passivation layer is accomplished by an ion milling process.

23. The method of claim 13 wherein the step of removing portions of the passivation layer is accomplished by a sputter etching process.

24. The method of claim 13 wherein the step of depositing a passivation layer comprises an initial step of cleaning the surface of the substrate.

25. The method of claim 24 wherein the step of cleaning is accomplished by a gas phase etch which utilizes a methyl radical to etch the surface of the substrate.

26. A method of fabricating an array of IR radiation responsive photodiodes comprising the steps of:

providing a body comprised of $Hg_{(1-x)}Cd_xTe$ p-type material having a characteristic energy bandgap;

depositing a passivation layer over a surface of the body, the passivation layer being comprised of semiconductor material comprised of CdTe, CdZnTe, HgCdTe or HgCdZnTe or combinations thereof, the semiconductor material having a characteristic energy bandgap that is wider than the characteristic energy bandgap of the body for repelling holes and electrons from the surface of the body;

depositing a mask layer over the passivation layer, the mask layer having at least one opening therethrough for defining an individual photodiode; and within a single vacuum chamber means performing at least the following two steps of:

ion bombarding the passivation layer to remove portions of the passivation layer exposed through the openings within the first mask layer thereby exposing portions of the underlying body, the step of ion bombarding simultaneously converting a top surface region of the exposed portions of the body to an n-type of material thereby forming a p-n diode junction at the interface of the p-type and n-type material, the step of ion bombarding further simultaneously cleaning a top surface of the converted top surface region for preparing the converted top surface region for a subsequent metallization step; and depositing a layer of metallization over exposed surfaces of the first mask layer, the passivation layer and the converted top surface regions of the body.

27. A method as set forth in claim 26 and further comprising the steps of:

removing the body from the vacuum chamber means; and removing the first mask layer and the associated overlying metallization layer for forming individual photodiodes having contact metallization deposited thereon.

28. A method as set forth in claim 27 wherein the step of ion bombarding is accomplished within the vacuum chamber means by a step of ion milling or sputter etching.

29. A method as set forth in claim 28 wherein the step of depositing a layer of metallization is accomplished within the vacuum chamber means by a step of sputtering, thermal evaporation or electron beam deposition.

30. A method as set forth in claim 26 and including an additional step of doping a top surface of the passivation layer to isolate electrical charge thereon from the underlying body.

* * * * *